United States Patent
Douskey et al.

(10) Patent No.: US 10,024,917 B1
(45) Date of Patent: Jul. 17, 2018

(54) IMPLEMENTING DECREASED SCAN DATA INTERDEPENDENCE FOR COMPRESSED PATTERNS IN ON PRODUCT MULTIPLE INPUT SIGNATURE REGISTER (OPMISR) THROUGH SPREADING IN STUMPMUX DAISY-CHAIN STRUCTURE

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US); Phillip A. Senum, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/498,240

(22) Filed: Apr. 26, 2017

(51) Int. Cl.
    *G01R 31/3177* (2006.01)
    *G01R 31/317* (2006.01)
    *G01R 31/327* (2006.01)

(52) U.S. Cl.
    CPC ..... *G01R 31/3177* (2013.01); *G01R 31/3172* (2013.01); *G01R 31/31723* (2013.01)

(58) Field of Classification Search
    CPC ............ G01R 31/3177; G01R 31/3183; G01R 31/318536; G01R 31/3172; G01R 31/31723
    See application file for complete search history.

(56) References Cited

U.S. PATENT DOCUMENTS

| | | | |
|---|---|---|---|
| 5,420,809 A * | 5/1995 | Read | G06F 17/153 708/200 |
| 7,225,376 B2 | 5/2007 | Appinger et al. | |
| 7,487,420 B2 | 2/2009 | Keller | |
| 7,734,973 B2 | 6/2010 | Hiraide et al. | |
| 8,996,941 B2 | 3/2015 | Lin et al. | |
| 9,103,879 B2 | 8/2015 | Douskey et al. | |
| 9,110,135 B2 | 8/2015 | Douskey et al. | |
| 9,606,179 B1 * | 3/2017 | Cunningham | G01B 31/31854 |

(Continued)

OTHER PUBLICATIONS

IBM, ip.com, Modified multiple input signature to improve test diagnostics. IBM TDB, IP.com No. IPCOM000171325D, Jun. 4, 2008.

*Primary Examiner* — April Y Blair
*Assistant Examiner* — Dipakkumar Gandhi
(74) *Attorney, Agent, or Firm* — Joan Pennington (57) ABSTRACT

A method and circuit for implementing enhanced scan data testing with decreased scan data interdependence for compressed patterns in On Product Multiple Input Signature Register (OPMISR) testing through spreading in a stump mux data chain structure, and a design structure on which the subject circuit resides are provided. The stump mux chain structure includes a plurality of stump muxes connected in series by a respective rotation function. A respective exclusive OR (XOR) spreading function included with each of the plurality of stump muxes provides channel inputs. XOR inputs are applied to each XOR spreading function providing unique input combinations for each respective channel included with each of said plurality of stump muxes. The respective rotation function enables test data to be rotated as scan data enters each stump mux to further make the test data unique for each stump mux.

20 Claims, 10 Drawing Sheets

(56) References Cited

U.S. PATENT DOCUMENTS

| | | | |
|---|---|---|---|
| 2002/0162065 A1* | 10/2002 | Kashiwagi | G11C 29/12 714/726 |
| 2006/0282730 A1* | 12/2006 | Arai | G01R 31/31854 714/726 |
| 2015/0113494 A1* | 4/2015 | Maling | H01L 22/30 716/122 |
| 2015/0169423 A1* | 6/2015 | Cook | G06F 11/27 714/733 |

* cited by examiner

| VERSION | 32 | PINS | | | | | | | | | | | | | | | | | GAP | GAP | GAP |
|---|---|---|---|---|---|---|---|---|---|---|---|---|---|---|---|---|---|---|---|---|---|
| CHANNELS | RENUM | 0 | 1 | 2 | 3 | 4 | 5 | 6 | 7 | 8 | 9 | 10 | 11 | 12 | 13 | 14 | 15 | | | | |
| 0 | 0 | 1 | 1 | 1 | | | | | | | | | | | | | | 3 | 0 | 0 | 29 |
| 1 | 2 | | | 1 | 1 | | 1 | | | | | | | | | | | 3 | 0 | 1 | 28 |
| 2 | 4 | | | | | 1 | 1 | | 1 | | | | | | | | | 3 | 0 | 2 | 27 |
| 3 | 6 | | | | | | | 1 | 1 | | | 1 | | | | | | 3 | 0 | 3 | 26 |
| 4 | 14 | | | | | | | | | 1 | 1 | | | | | 1 | | 3 | 0 | 4 | 25 |
| 5 | 10 | | | | | | | | | | | 1 | 1 | | | | | 3 | 0 | 5 | 24 |
| 6 | 12 | | | | | | | | | | | | | 1 | 1 | | | 3 | 0 | 6 | 23 |
| 7 | 15 | | | | | | | | | | | | | | | 1 | 1 | 3 | 0 | 7 | 22 |
| 8 | 16 | | | | | | | | | | | | | | | | | 3 | 0 | 8 | 21 |
| 9 | 18 | | | | | | | | | | | | | | | | | 3 | 0 | 9 | 20 |
| 10 | 20 | 1 | | | | | | | | | | | | | | | | 3 | 0 | 10 | 19 |
| 11 | 3 | | | | 1 | | | | | | | | | | | | | 3 | 0 | 11 | 18 |
| 12 | 25 | | | | | | 1 | | | | | | | | | | | 3 | 0 | 12 | 17 |
| 13 | 9 | | | | | | | | | 1 | | | | | | | | 3 | 0 | 13 | 16 |
| 14 | 29 | | | | | | | | | | | | | 1 | | | | 3 | 0 | 14 | 15 |
| 15 | 31 | | | | | | | | | | | | | | | | 1 | 3 | 0 | 15 | 14 |
| 16 | 1 | | 1 | | 1 | | | | | | | | | | | | | 3 | 1 | 1 | 27 |
| 17 | 17 | | | | | | | | | | | | | | | | | 3 | 1 | 2 | 25 |
| 18 | 24 | | | | | | | | | | | | | | | 1 | | 3 | 1 | 7 | 20 |
| BALANCE COUNT | | 3 | 3 | 3 | 3 | 3 | 3 | 3 | 3 | 3 | 3 | 3 | 3 | 3 | 3 | 3 | 3 | | | | |

| VERSION | 32 | PINS | | | | | | | | | | | | | | | | | GAP | GAP | GAP |
|---|---|---|---|---|---|---|---|---|---|---|---|---|---|---|---|---|---|---|---|---|---|
| CHANNELS | RENUM | 0 | 1 | 2 | 3 | 4 | 5 | 6 | 7 | 8 | 9 | 10 | 11 | 12 | 13 | 14 | 15 | 3 | 1 | 9 | 18 |
| 19 | 13 | | | | | | | | | | | | | | 1 | | 1 | 3 | 1 | 13 | 15 |
| 20 | 26 | | | | | | | | | | | 1 | | 1 | | | | 3 | 1 | 15 | 13 |
| 21 | 11 | | | | | | | | | 1 | | 1 | | | | | | 3 | 1 | 19 | 9 |
| 22 | 8 | | | | | | | 1 | | 1 | | | | | | | | 3 | 1 | 21 | 7 |
| 23 | 5 | | | | | | 1 | | 1 | | | | | | | | | 3 | 1 | 25 | 3 |
| 24 | 30 | | | | 1 | | 1 | | | | | | | | | | | 3 | 2 | 7 | 20 |
| 25 | 22 | | 1 | | | | | | | | | | | | | | | 3 | 2 | 8 | 19 |
| 26 | 23 | 1 | | | | | | | | | | | | | | | | 3 | 2 | 11 | 16 |
| 27 | 27 | | | | | | | | | | | | 1 | | | | | 3 | 2 | 14 | 13 |
| 28 | 7 | | | | | | | | 1 | | | | | | | | | 3 | 2 | 16 | 11 |
| 29 | 19 | | | | | 1 | | | | | | | | | | | | 3 | 2 | 18 | 9 |
| 30 | 28 | | | | | | | | | | | | | | | | | 3 | 2 | 23 | 4 |
| 31 | 21 | | | | | | | | | | | | | | 1 | | | | | | |
| BALANCE COUNT | | 3 | 3 | 3 | 3 | 3 | 3 | 3 | 3 | 3 | 3 | 3 | 3 | 3 | 3 | 3 | 3 | | | | |

| VERSION | 32 | PINS | | | | | | | | | | | | | | | | | GAP | GAP | GAP |
|---|---|---|---|---|---|---|---|---|---|---|---|---|---|---|---|---|---|---|---|---|---|
| CHANNELS | RENUM | 16 | 17 | 18 | 19 | 20 | 21 | 22 | 23 | 24 | 25 | 26 | 27 | 28 | 29 | 30 | 31 | | | | |
| 0 | 0 | | | | | | | | | | | | | | | | | 3 | 0 | 0 | 29 |
| 1 | 2 | | | | | | | | | | | | | | | | | 3 | 0 | 1 | 28 |
| 2 | 4 | | | | | | | | | | | | | | | | | 3 | 0 | 2 | 27 |
| 3 | 6 | | | | | | | | | | | | | | | | | 3 | 0 | 3 | 26 |
| 4 | 14 | | | | | | | | | | | | | | | | | 3 | 0 | 4 | 25 |
| 5 | 10 | | 1 | | | | | | | | | | | | | | | 3 | 0 | 5 | 24 |
| 6 | 12 | | | | 1 | | | | | | | | | | | | | 3 | 0 | 6 | 23 |
| 7 | 15 | | | | | | 1 | | | | | | | | | | | 3 | 0 | 7 | 22 |
| 8 | 16 | 1 | 1 | | | | | | 1 | | | | | | | | | 3 | 0 | 8 | 21 |
| 9 | 18 | | | 1 | 1 | | | | | | | | | 1 | | | | 3 | 0 | 9 | 20 |
| 10 | 20 | | | | 1 | 1 | | | | | | | | | | | | 3 | 0 | 10 | 19 |
| 11 | 3 | | | | | | | 1 | 1 | | | | | | | | | 3 | 0 | 11 | 18 |
| 12 | 25 | | | | | | | | | 1 | 1 | | | | | | | 3 | 0 | 12 | 17 |
| 13 | 9 | | | | | | | | | | | 1 | 1 | | | | | 3 | 0 | 13 | 16 |
| 14 | 29 | | | | | | | | | | | | | 1 | 1 | | | 3 | 0 | 14 | 15 |
| 15 | 31 | | | | | | | | | | | | | | | 1 | 1 | 3 | 0 | 15 | 14 |
| 16 | 1 | | | | | | | | | | | | | | | | 1 | 3 | 1 | 1 | 27 |
| 17 | 17 | | 1 | | 1 | | | 1 | | | | | | | | | | 3 | 1 | 2 | 25 |
| 18 | 24 | 1 | | | | | | 1 | | | | | | | | | | 3 | 1 | 7 | 20 |
| BALANCE COUNT | | 3 | 3 | 3 | 3 | 3 | 3 | 3 | 3 | 3 | 3 | 3 | 3 | 3 | 3 | 3 | 3 | | | | |

| VERSION | 32 | PINS | | | | | | | | | | | | | | | | GAP | GAP | GAP |
|---|---|---|---|---|---|---|---|---|---|---|---|---|---|---|---|---|---|---|---|---|
| CHANNELS | RENUM | 16 | 17 | 18 | 19 | 20 | 21 | 22 | 23 | 24 | 25 | 26 | 27 | 28 | 23 | 30 | 31 | | | |
| 19 | 13 | | | | | | | | | 1 | | | | | | | | 3 | 1 | 9 | 18 |
| 20 | 26 | | | | | | | | | | | 1 | | | | | | 3 | 1 | 13 | 15 |
| 21 | 11 | | | | | | | | | | | | 1 | | | | | 3 | 1 | 15 | 13 |
| 22 | 8 | | | | | | | | | | | | | 1 | | | | 3 | 1 | 19 | 9 |
| 23 | 5 | | | | | | | | | | | | | | | 1 | | 3 | 1 | 21 | 7 |
| 24 | 30 | | | | | | | | | | | | | | | | 1 | 3 | 1 | 25 | 3 |
| 25 | 22 | | | | | | | 1 | | 1 | | | | | | | | 3 | 2 | 7 | 20 |
| 26 | 23 | | | | 1 | | | 1 | | | | | | | | | | 3 | 2 | 8 | 19 |
| 27 | 27 | | | | | | | | | | | | 1 | | | 1 | | 3 | 2 | 11 | 16 |
| 28 | 7 | | | | | 1 | | 1 | | | | | | | | | | 3 | 2 | 14 | 13 |
| 29 | 19 | 1 | | | 1 | | | | | | | | | | | | | 3 | 2 | 16 | 11 |
| 30 | 28 | | 1 | | | | | | | | | | | 1 | | | 1 | 3 | 2 | 18 | 9 |
| 31 | 21 | | 1 | | | 1 | | | | | | | | | | | | 3 | 2 | 23 | 4 |
| BALANCE COUNT | | 3 | 3 | 3 | 3 | 3 | 3 | 3 | 3 | 3 | 3 | 3 | 3 | 3 | 3 | 3 | 3 | | | | |

IMPLEMENTING DECREASED SCAN DATA INTERDEPENDENCE FOR COMPRESSED PATTERNS IN ON PRODUCT MULTIPLE INPUT SIGNATURE REGISTER (OPMISR) THROUGH SPREADING IN STUMPMUX DAISY-CHAIN STRUCTURE

FIELD OF THE INVENTION

The present invention relates generally to the data processing field, and more particularly, relates to a method and circuit for implementing enhanced scan testing with decreased scan data interdependence for compressed patterns in on product multiple input signature register (OPMISR) testing through spreading in a stump mux data chain structure, and a design structure on which the subject circuit resides.

DESCRIPTION OF THE RELATED ART

Circuits often are prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. In typical scan pattern based tests, chips are tested by scanning data into every latch in the design through a narrow, usually 32-bit wide, scan-in port and triggering functional clock pulses. Then, data is scanned out through another narrow, usually 32-bit wide, scan-out port, where it is compared to pre-computed values.

There are a few different ways that this scan-in bus can be delivered to all parts of a chip. In the naïve approach, each of the 32 scan chains contain 1/32nd of the total logic of the chip. This works and allows for the most unique data in each scan cycle, but it takes a lot of data volume to make this possible. Plus, test tends to require a lot of time since the entire chip is scanned in and out in each test iteration.

Alternatively, the 32-bit scan-in bus can be delivered in parallel to many parts of the chip (usually through a fan-out network feeding many channels, which in turn feed a section of logic on the chip) at once. Typically when this is accompanied with a Multiple Input Signature Register (MISR) for an on-chip data compression called On Product Multiple Input Signature Register (OPMISR). OPMISR designs allow deterministic test data via scan inputs to be fanned out to multiple channels, the test is performed, and then the data collected in an On Product MISR. In this manner, shorter data strings than in the typical full scan testing may be created reducing data volume, thus saving tester data volume, but creating an interdependence of data between channels that receive the same data. Since multiple channels receive the same test data, scan data interdependence may limit test coverage. This can simply make some logic untestable or at least reduce fault coverage per cycle. This is because as each test targets a specific section of logic; feeding that same test data to other sections may not do as good a job of detecting faults there. As a result, more tests will be created to target faults in the second section of logic. So, test coverage per test pattern decreases, when compared with the fully independent scanned test data. While this seems to increase the number of tests required, the shortened scan segments used for this OPMISR test allow for an increased test count in the same data volume.

Figure 2:
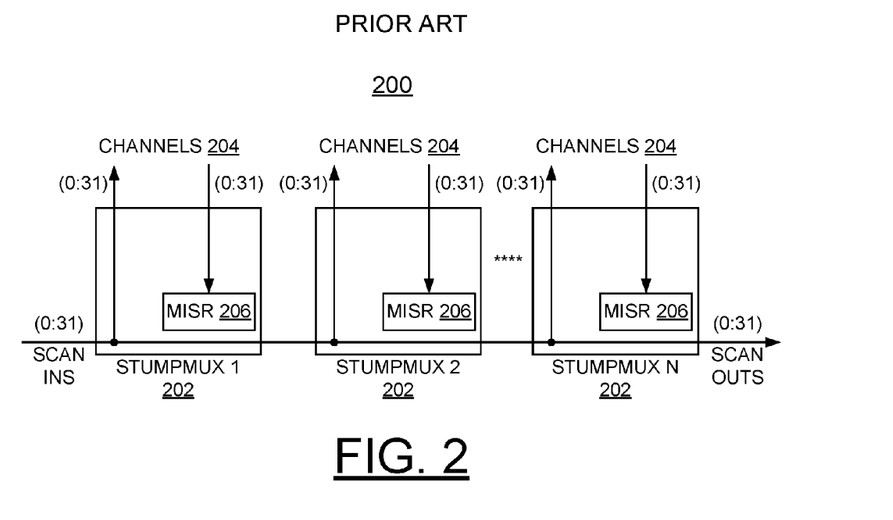
FIG. 2 illustrates a prior art OPMISR stump mux data chain structure.

FIG. 2 illustrates a conventional OPMISR design that allows deterministic test data via scan inputs to be fanned out to multiple channels, the test is performed, and then the data collected in an On Product MISR. In this manner, shorter data strings than in the typical full scan testing may be created, thus saving tester data volume. However since multiple channels get the same test data, scan data interdependence may limit test coverage. The current Server STUMPMUX daisy-chain has this type of design and depending on the scan path order and data path arrangement, may be subject to this limitation.

A need exists for implementing enhanced scan data testing with decreased scan data interdependence for compressed patterns in on product multiple input signature register (OPMISR) testing through spreading in a stump mux data chain structure, and to improve both data volume compression and test coverage.

SUMMARY OF THE INVENTION

Principal aspects of the present invention are to provide a method and circuit for implementing enhanced scan data testing with decreased scan data interdependence for compressed patterns in On Product Multiple Input Signature Register (OPMISR) testing through spreading in a stump mux data chain structure, and a design structure on which the subject circuit resides. Other important aspects of the present invention are to provide such method, circuit and design structure substantially without negative effects and that overcome many of the disadvantages of prior art arrangements.

In brief, a method and circuit for implementing enhanced scan data testing with decreased scan data interdependence for compressed patterns in On Product Multiple Input Signature Register (OPMISR) testing through spreading in a stump mux data chain structure, and a design structure on which the subject circuit resides are provided. The stump mux chain structure includes a plurality of stump muxes connected in series by a respective rotation function. A respective exclusive OR (XOR) spreading function included with each of the plurality of stump muxes provides channel inputs. XOR inputs are applied to each XOR spreading function providing unique input combinations for each respective channel included with each of said plurality of stump muxes. The respective rotation function enables test data to be rotated as scan data enters each stump mux to further make the test data unique for each stump mux.

In accordance with features of the invention, the rotation function provides a rotate by 1 function.

In accordance with features of the invention, the respective XOR spreading function includes a multiple input XOR.

In accordance with features of the invention, the multiple input XOR includes a 3-input XOR.

In accordance with features of the invention, the XOR inputs are applied to each XOR spreading function by selected enable spread inputs.

In accordance with features of the invention, the XOR spreading function includes a 3-input XOR, and at least two of the XOR inputs are applied from a respective output of a pair of AND gates with the pair of AND gates receiving respective enable spread inputs.

In accordance with features of the invention, a multiple input signature register (MISR) receiving each respective channel outputs included with each of said plurality of stump muxes.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing enhanced scan data testing with decreased scan data interdependence for compressed patterns in on product multiple input signature register (OPMISR) testing through spreading in a stump mux data chain structure, and a design structure are provided.

Figure 1:
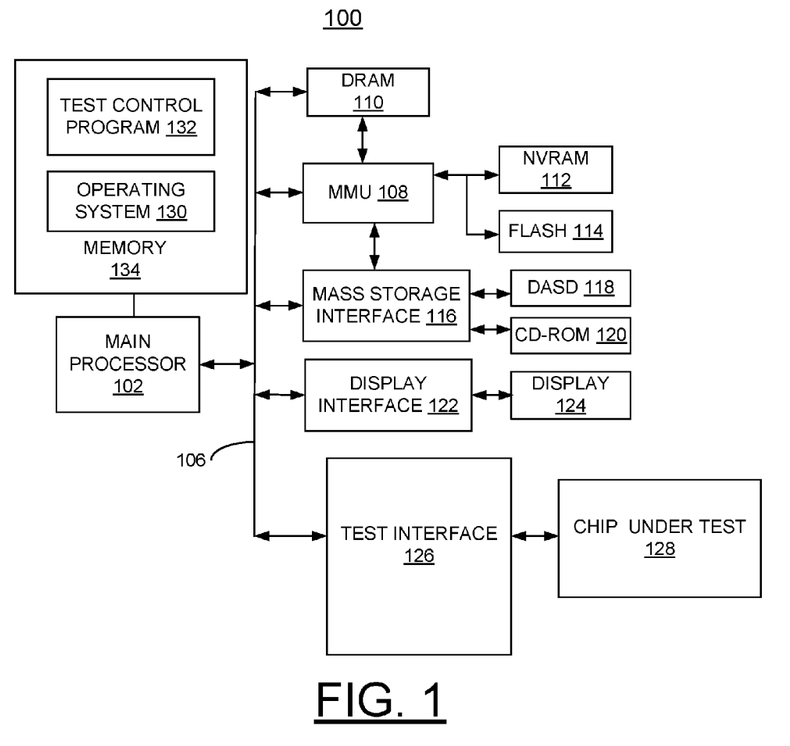
FIG. 1 is a schematic and block diagram representation illustrating an exemplary computer test system for implementing enhanced scan data testing with decreased scan data interdependence for compressed patterns in on product multiple input signature register (OPMISR) testing through spreading in a stump mux data chain structure in accordance with preferred embodiments.

Having reference now to the drawings, in FIG. 1, there is shown an exemplary computer test system generally designated by the reference character 100 for implementing enhanced scan data testing with decreased scan data interdependence for compressed patterns in on product multiple input signature register (OPMISR) testing through spreading in a stump mux data chain structure in accordance with preferred embodiments. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 126. Computer system 100 includes an operating system 130, and a test control program 132 of the preferred embodiment resident in a memory 134. The test interface 126 provides selective control by the test control program 132 for example operations as illustrated and described with respect to circuits 300 and 400 and FIGS. 3, 4, 5A, 5B, 5C, and 5D.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors A conventional stump mux circuit 200 is shown including a plurality of stump muxes 1-N, 202, connected in series or in a daisy chain. In the conventional stump mux circuit 200 the 32 scan data paths feed through all stump muxes 1-N, 202 in series. At each of the stump muxes 1-N, 202, the 32 data stream feed into respective local channels 204 and feed forward to the next stump mux 202. At each of the stump muxes 1-N, 202, each of the local channels 204 is provided with a Multiple Input Signature Register (MISR) 206 for an on-chip data compression or On Product Multiple Input Signature Register (OPMISR). This reduces data volume, while creating an interdependence of data between channels that receive the same data. This can simply make some logic untestable or at least reduce fault coverage per cycle. Should the same location in two channel 0's need opposite initial values to test a structure, the pattern cannot be loaded. All stump muxes 1-N, 202 are identical, so simply adding a spreading function before the channels does nothing to solve this issue. In the prior art stump mux circuit 200, all channel 0's get the same data, all channel 1's get the same data, and the like.

In accordance with features of the invention, a structure is provided that creates unique pin combinations for every channel, without requiring multiple unique stump mux designs, and this structure supports testing in a full scan environment.

Figure 3:
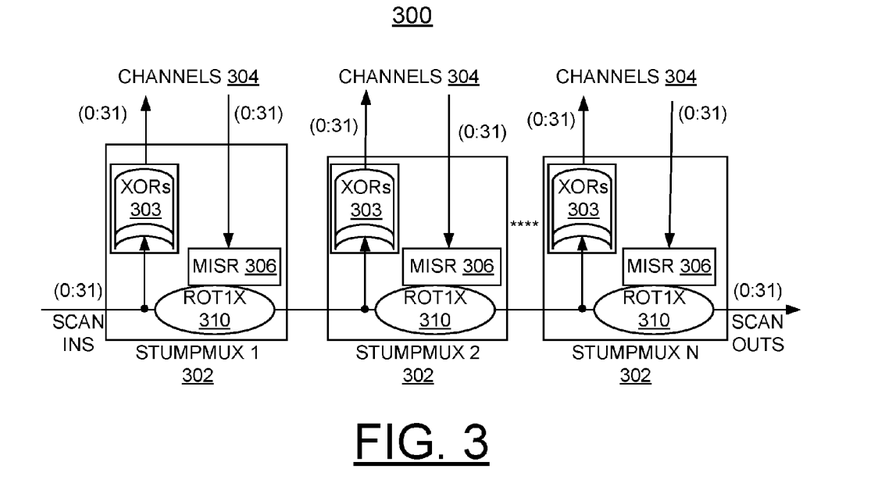
FIG. 3 illustrates an example circuit for implementing enhanced scan data testing with decreased scan data interdependence for compressed patterns in OPMISR stump mux data chain structure in accordance with preferred embodiments.

Referring now to FIG. 3, there is shown an example circuit generally designated by the reference character 300 for implementing enhanced scan data testing with decreased scan data interdependence for compressed patterns in OPMISR stump mux data chain structure in accordance with preferred embodiments. The OPMISR stump mux data chain circuit 300 includes a plurality of stump muxes 1-N, 302, providing channel data via a respective exclusive OR (XOR) 303 to respective channels (0:31) 304. Each channel output (0:31) of the respective channels 304 is connected to a respective Multiple Input Signature Register (MISR) 306 for OPMISR testing. The OPMISR stump mux data chain circuit 300 further includes a rotation function 310 such as a rotate by 1 (ROT1X) 310, as shown. The XOR 303 together with rotation function 310, ROT1X solves the local data interdependence issue. The rotation function 310, ROT1X rotates the scan bus data by 1 before it leaves each stump mux 302.

Figure 4:
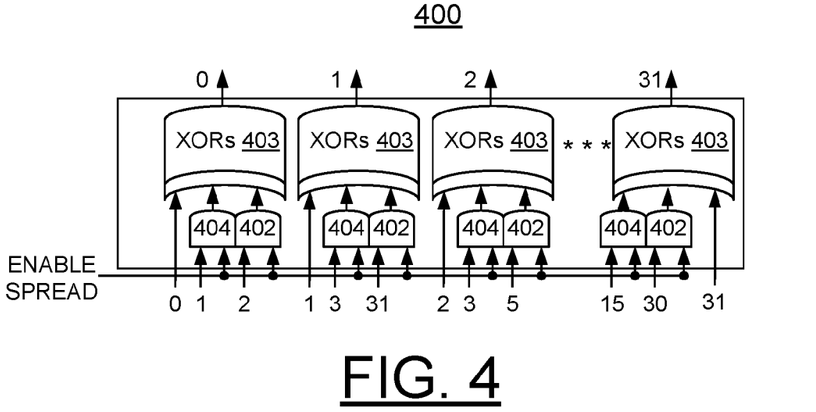
FIG. 4 illustrates additional features of the circuit of FIG. 3 for implementing enhanced scan data testing with decreased scan data interdependence for compressed patterns in OPMISR stump mux data chain structure in accordance with preferred embodiments.
Figure 5A:
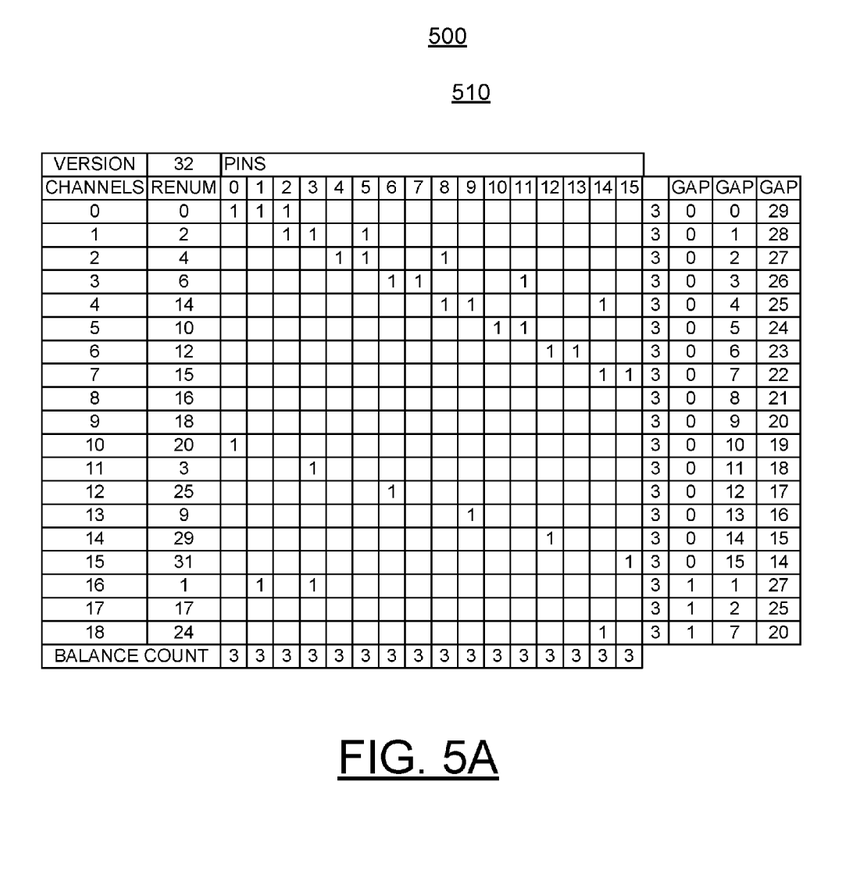
FIGS. 5A, 5B, 5C, and 5D together illustrate an exemplary computer test system for implementing a method for providing enhanced scan data testing with decreased scan data interdependence with on product multiple input signature register (OPMISR) testing through spreading in a stump mux data chain structure in accordance with preferred embodiments.
Figure 5B:
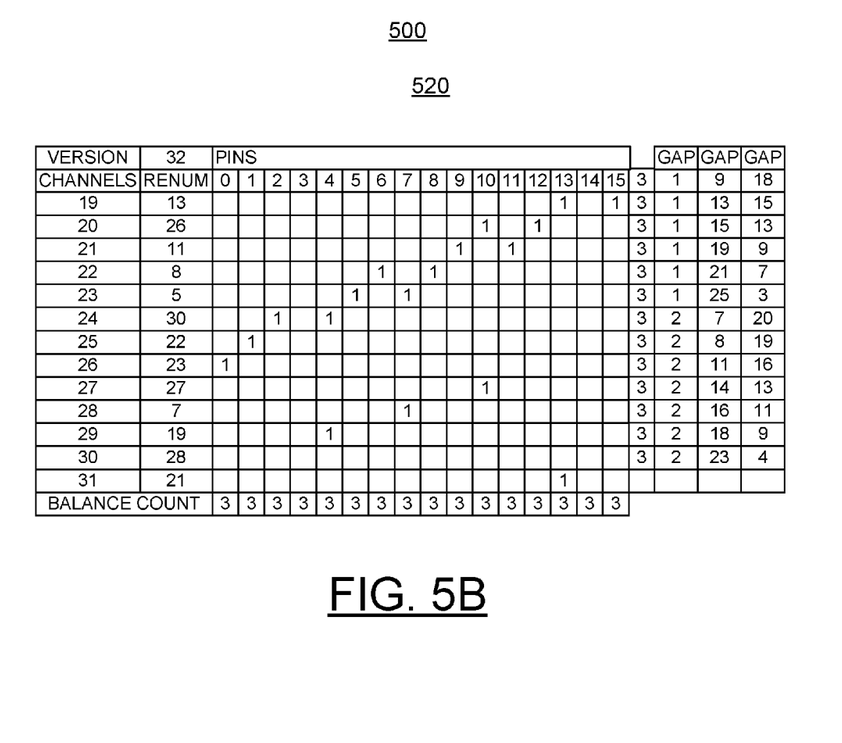
Figure 5C:
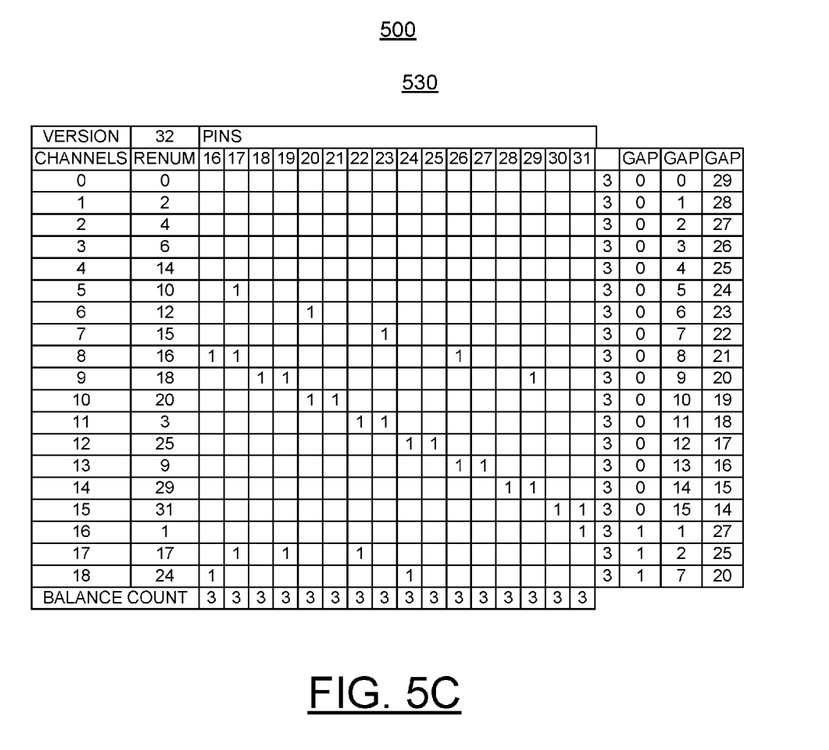
Figure 5D:
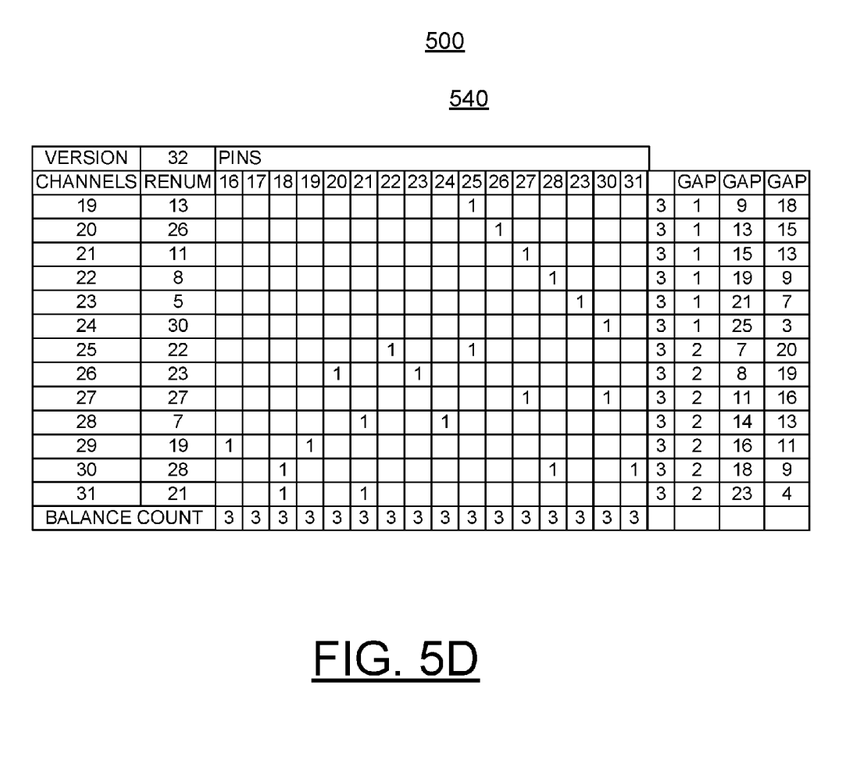

Referring also to FIG. 4, there are shown additional features of the circuit 300 for implementing enhanced scan data testing with decreased scan data interdependence for compressed patterns in OPMISR stump mux data chain structure in accordance with preferred embodiments. A plurality of inputs (three inputs as shown) is applied to each respective XOR 303 directly and with a respective output of a pair of AND gates 402 from enable spread inputs. The XOR inputs are selected so they are not only unique for each channel within a stump mux 302, but when rotated remain unique for all 32 rotations available with the 32 bits between stump muxes 302. After 32 stump muxes 302 or 1024 channels, the pattern will repeat. It is a safe assumption that once that distance is traveled the new channels will not be related to each other.

In accordance with features of the invention, optionally a new spreading function can be started using a second stump mux type, and again rotated through 32 times. FIGS. 5A, 5B, 5C, and 5D shows one spreading network that suites this purpose.

FIGS. 5A, 5B, 5C, and 5D together illustrate an exemplary spreading network generally designated by the reference character 500 for OPMISR testing through spreading in a stump mux data chain structure in accordance with preferred embodiments. Spreading network 500 includes channels 0-31 and pins 0-15 generally designated by the reference characters 510, 520, with channels 0-18 shown in FIG. 5A channels 19-31 shown in 5B. Spreading network 500 includes channels 0-31 and pins 16-31 generally designated by the reference characters 530, 540, with channels 0-18 shown in FIG. 5C and channels 19-31 shown in 5D. For the 3 bit XOR 303, 4 full versions of the table 500 can be created supporting 4096 channels before repetition occurs. Additionally for efficiency the selection of XOR inputs can contain the original scan channel, allowing the spreading function to be disabled for normal full scanning with minimal logic. FIGS. 5A, 5B, 5C, and 5D together illustrate perfectly balanced 32 (renumbered so the original channel is part of the overall encode). In FIGS. 5A, 5B, 5C, and 5D, a balanced count of 3 is shown at the bottom and right of the encode together with three gap values per channel, as shown.

Figure 6:
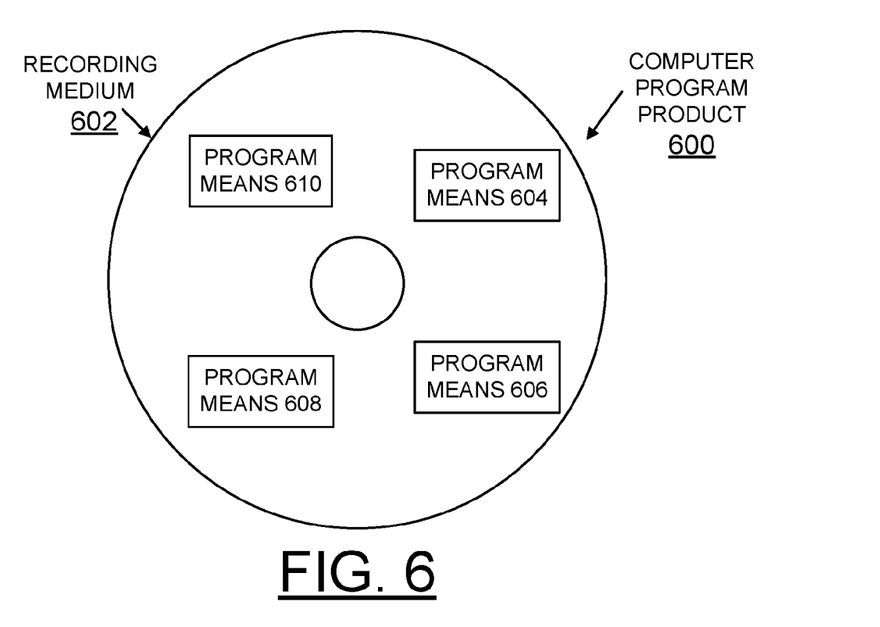
FIG. 6 is a block diagram illustrating a computer program product in accordance with the preferred embodiments.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, or another similar computer program product. Recording medium 602 stores program means 604, 606, 608, and 610 on the medium 602 for carrying out the methods for implementing enhanced scan data testing with decreased scan data interdependence for compressed patterns in OPMISR stump mux data chain structure of the preferred embodiment with the example circuits of FIGS. 3 and 4 and the system 100 of FIG. 1.

A sequence of program instructions or a logical assembly of one or more interrelated modules defined by the recorded program means 604, 606, 608, and 610, direct the computer system 100 for implementing enhanced scan data testing with decreased scan data interdependence of the preferred embodiment.

Figure 7:
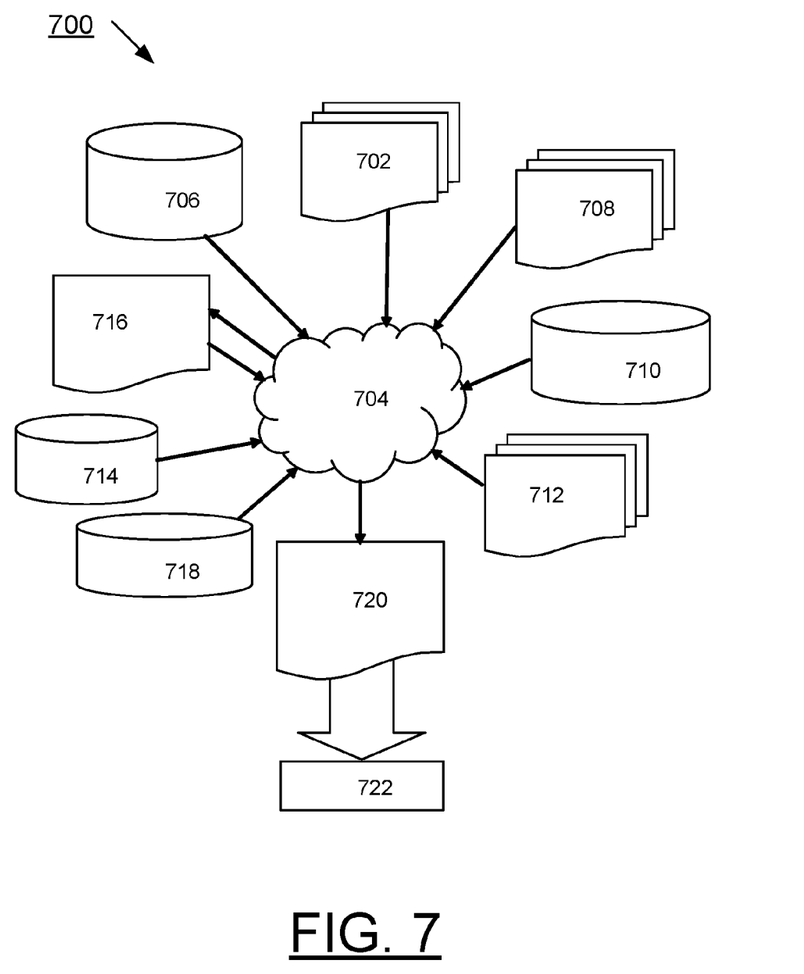
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuits 300, 400 in the form of schematics or HDL, a hardware-description language, for example, Verilog, VHDL, C, and the like. Design structure 702 may be contained on one or more machine readable medium. For example, design structure 702 may be a text file or a graphical representation of circuit 100. Design process 704 preferably synthesizes, or translates, circuits 300, 400 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuits.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 47 nm, 50 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 1, 3, and 4 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 3, and 4. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing enhanced scan data testing with decreased scan data interdependence for compressed patterns in on product multiple input signature register (OPMISR) testing through spreading in a stump mux chain structure, said circuit comprising:
   the stump mux chain structure including a plurality of stump muxes connected in series by a respective rotation function, each stump mux providing scan bus test data to each of a plurality of respective associated channels;
   a respective exclusive OR (XOR) spreading function included with each of said plurality of stump muxes, said XOR spreading function providing channel inputs to each of the plurality of respective associated channels; and
   XOR inputs coupled from a scan bus applied to said XOR spreading function providing unique input combinations for each of the plurality of respective channels included with each of said plurality of stump muxes, and said respective rotation function enabling scan bus test data to be rotated enabling unique scan data for enhanced scan data testing as scan data enters each said stump mux in series breaking local data interdependence.

2. The circuit as recited in claim 1, wherein said rotation function provides a rotate function.

3. The circuit as recited in claim 1, wherein said respective XOR spreading function includes a multiple input XOR.

4. The circuit as recited in claim 1, includes multiple enable spread inputs coupled to each respective XOR spreading function.

5. The circuit as recited in claim 1, wherein said respective XOR spreading function includes a multiple-input XOR, and at least two of said XOR inputs are applied from a respective output of a pair of AND gates, said pair of AND gates receiving respective enable spread inputs.

6. The circuit as recited in claim 1, includes a multiple input signature register (MISR) receiving channel outputs included with each of said plurality of stump muxes.

7. A design structure embodied in a non-transitory machine readable medium for designing, manufacturing, and testing an integrated circuit, the design structure comprising:
   a circuit tangibly embodied in the non-transitory machine readable medium used in a design process, said circuit for implementing enhanced scan data testing with decreased scan data interdependence for compressed patterns in on product multiple input signature register (OPMISR) testing through spreading in a stump mux chain structure, said circuit comprising:
   the stump mux chain structure including a plurality of stump muxes connected in series by a respective rotation function, each stump mux providing scan bus test data to each of a plurality of respective associated channels;
   a respective exclusive OR (XOR) spreading function included with each of said plurality of stump muxes, said XOR spreading function providing test data channel inputs to each of a plurality of respective associated channels; and
   XOR inputs coupled from a scan bus applied to said XOR spreading function providing unique input combinations for each of the plurality of respective associated channels included with each of said plurality of stump muxes, and said respective rotation function enabling scan bus test data to be rotated enabling unique scan data for enhanced scan data testing as scan data enters each said stump mux in series breaking local data interdependence, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure of claim 7, wherein the design structure includes at least one of test data files, characterization data, verification data, or design specifications.

11. The design structure of claim 7, wherein said rotation function provides a rotate function.

12. The design structure of claim 7, wherein said respective XOR spreading function includes a multiple input XOR.

13. The design structure of claim 7, includes multiple enable spread inputs coupled to each respective XOR spreading function.

14. The design structure of claim 7, wherein said respective XOR spreading function includes a multiple input XOR, and at least two of said XOR inputs are applied from a respective output of a pair of AND gates, said pair of AND gates receiving respective enable spread inputs.

15. The design structure of claim 7, includes a multiple input signature register (MISR) receiving channel outputs included with each of said plurality of stump muxes.

16. A method for implementing enhanced scan data testing with decreased scan data interdependence for compressed patterns in on product multiple input signature register (OPMISR) testing through scan skewing, said method comprising:
   providing a stump mux chain structure with a plurality of stump muxes connected in series by a respective rotation function, each stump mux providing scan bus test data to each of a plurality of respective associated channels;
   providing a respective exclusive OR (XOR) spreading function included with each of said plurality of stump muxes providing test data channel inputs to each of a plurality of respective associated channels; and
   applying XOR inputs coupled from a scan bus applied to said XOR spreading function for providing unique test data input combinations for each of the plurality of respective channels included with each of said plurality of stump muxes, and said respective rotation function enabling test data to be rotated enabling unique scan data for enhanced scan data testing as scan data enters each stump mux in series breaking local data interdependence.

17. The method as recited in claim 16 include providing multiple enable spread inputs coupled to each respective XOR spreading function.

18. The method as recited in claim 16 wherein providing the stump mux chain structure with a plurality of stump muxes connected in series by a respective rotation function includes providing a rotate function.

19. The method as recited in claim 16 includes providing a multiple input signature register (MISR) receiving channel outputs included with each of said plurality of stump muxes.

20. The method as recited in claim 16 includes selecting XOR inputs to provide unique test data input combinations for each respective channel included within each of said plurality of stump muxes, and providing unique test data input combinations for 32 rotations available within 32 bits between said plurality of stump muxes.

\* \* \* \* \*